United States Patent [19]

McKenna et al.

[11] Patent Number: 4,757,208
[45] Date of Patent: Jul. 12, 1988

[54] MASKED ION BEAM LITHOGRAPHY SYSTEM AND METHOD

[75] Inventors: Charles M. McKenna, Boxford, Mass.; James E. Wood, Newbury Park, Calif.; John L. Bartelt, Thousand Oaks, Calif.; Ross D. Olney; J. William Ward, both of Canoga Park, Calif.; Charles W. Slayman, Newbury Park, Calif.

[73] Assignee: Hughes Aircraft Company, Los Angeles, Calif.

[21] Appl. No.: 837,127

[22] Filed: Mar. 7, 1986

[51] Int. Cl.$^4$ .......................................... H01J 37/317
[52] U.S. Cl. .................................. 250/492.2; 250/398
[58] Field of Search ............... 250/492.21, 492.2, 398, 250/423 R, 396, 396 R; 313/363.1

[56] References Cited

U.S. PATENT DOCUMENTS

| | | | |
|---|---|---|---|
| 3,845,312 | 10/1974 | Allison | 250/492.21 |
| 3,913,320 | 10/1975 | Reader et al. | 313/363.1 |
| 4,013,891 | 3/1977 | Ko et al. | 250/492.2 |
| 4,136,285 | 1/1979 | Anger et al. | 250/492.2 |
| 4,142,132 | 2/1979 | Harte | 250/492.2 |
| 4,158,141 | 6/1979 | Seliger et al. | 250/492.21 |
| 4,310,743 | 1/1982 | Seliger | 250/492.21 |
| 4,383,180 | 5/1983 | Turner | 250/492.2 |

FOREIGN PATENT DOCUMENTS 2328281  5/1977  France .

OTHER PUBLICATIONS

Seliger et al., Proceedings of the 13th Conference on Solid State Devices, Tokyo, 1981; Japanese Journal of Applied Physics, vol. 21 (1982), Supplement 21-1, pp. 3-10.
Miyauchi et al., Japanese Journal of Applied Physics, vol. 22, No. 5, part 2, May 1983, L287-L288.
Bohlen et al., Solid State Technology, vol. 27, No. 9, Sep. 1984, pp. 210-217.

*Primary Examiner*—Craig E. Church
*Assistant Examiner*—Jack I. Berman
*Attorney, Agent, or Firm*—Wanda K. Denson-Low; V. G. Laslo; A. W. Karambelas

[57] ABSTRACT

A masked ion beam lithography (MIBL) system and method is disclosed which is considerably more compact and economical than prior ion implantation devices. An H+ ion beam is extracted from a source in the form of an angularly expanding beam, and is transmitted through two lenses that sequentially accelerate the ions to energies in the range of 200-300 keV. The first lens focuses the beam so that it emerges from a crossover point with an amplified angular divergence at least three times the divergence of the initial beam, thereby considerably reducing the necessary column length. The second lens collimates the beam so that it can be directed onto a mask to expose resist on an underlying semiconductor substrate. A series of extraction electrodes are used to provide an initial point source beam with a desired angular expansion, and a specially designed sector magnet is positioned between the extraction mechanism and the first lens to remove particles heavier than H+ from the beam. Voltage ratios across the lenses and extraction electrodes can be varied in tandem, permitting control over the final beam energy by a simple voltage adjustment. The beam is aligned with the column axis and then steered into alignment with the mask channeling axis by a pair of octupole lenses.

25 Claims, 4 Drawing Sheets

MASKED ION BEAM LITHOGRAPHY SYSTEM AND METHOD

BACKGROUND OF THE INVENTION

1. Field of the Invention

This invention relates to the exposure of resists in the formation of integrated circuits, and more particularly to masked ion beam lithography exposure systems and methods.

2. Description of Related Art

Integrated circuits are generally formed with a series of masks that are used to create desired patterns on a semiconductive substrate. The substrate is initially coated with a resist material, and a mask carrying a desired pattern is positioned over the coated substrate. The substrate is then exposed, fixing the resist except where it has been shaded by the mask pattern. The shaded resist is then washed away in a solvent bath, and any underlying layer etched to reveal the substrate (for negative resists, the unexposed portions are washed away). Appropriate dopants or materials are next applied to the substrate, followed by the removal of the remaining resist, the application of another resist layer, and another mask iteration. This process continues for successive masks until the circuit pattern has been completed.

Ultraviolet light is commonly used in conjunction with a photoresist in fabricating integrated circuits. More recently, however, ion beam lithography techniques have been developed in which $H^+$ ions are used to expose an ion-sensitive resist material on the semiconductive substrate. Ion exposures yield much higher resolution patterns than those produced by ultraviolet light because, at submicrometer dimensions, light undergoes substantial diffraction whereas ions are not substantially influenced. Much of the basic masked ion beam lithography (MIBL) technology is disclosed in U.S. Pat. No. 4,101,782, R. L. Seliger, "Process For Making Patterns In Resist And For Making Ion Absorption Masks Useful Therewith", issued July 18, 1978, and U.s. Pat. No. 4,158,141, R. L. Seliger et al., "Process For Channeling Ion Beams", issued June 12, 1979.

Ion implantation accelerators have previously been used for doping semiconductors in the fabricating of integrated circuits. These same machines have also been adapted for experimental use to provide the necesssary ion exposure beam for an experimental MIBL system. While convenient because the equipment is already available, ion implantation accelerators are very large and overpowered for ion beam lithographic applications. Serious problems have been encountered in aligning the beam with the mask and the underlying substrate, in providing appropriate beam power, and in the expense of an exposure.

With the use of new channeling masks such as that disclosed in U.S. Pat. No. 4,158,141 to Seliger et al. and assigned to the assignee of the present invention, the mask must be held in accurate angular alignment with the beam. If the beam angle changes, it has been necessary in the past to tilt the mask by a corresponding amount. This in turn has required a similar tilting of the wafer and the entire wafer stage, a cumbersome procedure.

To generate the correct beam size, shape and collimation for illuminating a mask, a series of apertures through which the beam is passed during transit from its source to the mask have generally been employed. The size and shape of the apertures are selected so that they transmit only that portion of the beam which will produce the desired beam collimation. The rest of the beam around each aperture is blocked and wasted. This results in a loss of efficiency, since much of the beam whch is originally generated never reaches the mask or substrate. With system voltage differentials of up to 300 kV, the power loss can be significant.

With past systems it has also been difficult to obtain a pure $H^+$ beam. Undesired particles in the beam can bombard and heat the mask, resulting in distortion and misalignment, and can also be lead to undesired resist exposure. Such unwanted particles include H atoms and molecules, metal impurity ions resulting from sputtering inside the ion source, and sometimes ions from impurity gases.

In addition to MIBL, various alternate lithographic techniques have been explored. These approaches include direct-write electron beam lithography (EBL), x-ray lithography (XRL), and focused ion beam microfabrication. Each of these techniques has limitations that make a more efficient and practical MIBL system desirable. EBL is not well suited for high speed printing in the submicrometer feature size domain because of its slow, serial patterning with a finely focused beam. EBL systems used for integrated circuit fabrication are characterized by high cost and complexity, low throughput and marginal resolution. The emergence of XRL for integrated circuit fabrication has been delayed because of low throughput for submicrometer features. High resolutions can be obtained, but XRL is made difficult by the low x-ray absorption of high resolution resists, and by the low x-ray flux available for high resolution exposures. The possibility of using synchrotron emissionn as a source for x-ray exposures has also been considered, but involves problems of very high capital investment, operational costs, complexity, reliability, and radiation safety.

SUMMARY OF THE INVENTION

In view of the above problems associated with the prior art, it is an object of this invention to provide a novel and improved MIBL system and method which utilizes a very compact structure and carefully controls the dimensions of the ion exposure beam, and yet operates at beam energies up to 300 keV.

Another object is the provision of such an MIBL system and method, in which the ion beam is formed and directed to the mask in an energy efficient manner which utilizes much more of the initial beam current than in previous systems, and in which the beam energy may be conveniently varied.

A further object is the provision of such a novel and improved MIBL system and method, in which extraneous particles are effectively removed and the beam consists substantially of pure $H^+$ ions.

In the accomplished of these and other objects of the invention, an MIBL system is provided which includes means for holding a lithographic mask in a predetermined position with respect to a target, an ion source, means for extracting ions from the source and forming them into an expanding beam, and means for substantially collimating the beam toward the mask position. A dual electrode extraction mechanism forms $H^+$ ions from the source into an initial beam with a predetermined angular divergence, while a first lens positioned in the beam path focuses the beam with an angular convergence substantially greater than its initial divergence, thus amplifying the beam's angular expansion beyond the lens' focal (cross-over) point. The beam is then substantially collimated by a second lens which is positioned beyond the focal point of the first lens at a locationn corresponding to a desired collimated beam diameter. A sector magnet positioned in the beam path between the extraction mechanism and first lens deflects particles in the beam in accordance with their mass. The magnet transmits H+ ions along the desired beam path, while deflecting higher mass particles out of the beam.

An octupole deflector is used to steer the collimated beam into alignment with the channeling axis of the mask. The masked beam is received by a resist coated substrate which is aligned with the mask, and means are provided for rapidly moving the substrate relative to the beam for replicating the mask pattern on the substrate.

In a preferred embodiment the extraction mechanism includes a pair of electrodes spaced in succession from the ion source, with the spacings between electrodes and relative voltages applied to the electrodes designed to extract ions from the source in a beam having a predetermined angle of expansion. The electric field strength between the ion source and the nearer electrode is preferably about half of the electric field strength between the nearer and more distant electrodes.

The first and second lenses each preferably comprise dual cylinder lenses, and include means for establishing predetermined voltage differential ratios across the entrance and exit cylinders of each lens to shape the beam and accelerate the H+ ions therein. The first lens entrance cylinder is maintained at the same voltage as the exit electrode for the extraction mechanism, while its exit cylinder is maintained at the same voltage as the entrance cylinder for the second lens. The voltages of the ion source, extraction electrodes/first lens entrance cylinder, and first lens exit cylinder/second lens entrance cylinder are preferably maintained within the approximate ranges of 200–300 kV, 192–288 kV and 160–240 kV, respectively, relative to the second lens exit cylinder voltage. The absolute values of the voltage differentials across the entrance and exit cylinders of each lens can be varied while retaining the predetermined voltage differential ratios, thus providing control over the beam energy with a simple voltage adjustment.

The sector magnet is specially designed to preserve an apparent point source for the intial expanding beam and to transmit only H+ ions along the desired beam path. It is characterized as a 20° sector electromagnet with a 1.5 cm. pole gap, a flat entrance pole face at a tilt angle of substantially +8.2°, and a flat exit pole face at a tilt angle of substantially +5.5°.

Further features and advantages of the invention will be apparent to those skilled in the art from the following detailed description of a preferred embodiment, taken together with the accompanying drawings in which:

DETAILED DESCRIPTION OF A PREFERRED EMBODIMENT

Figure 1:
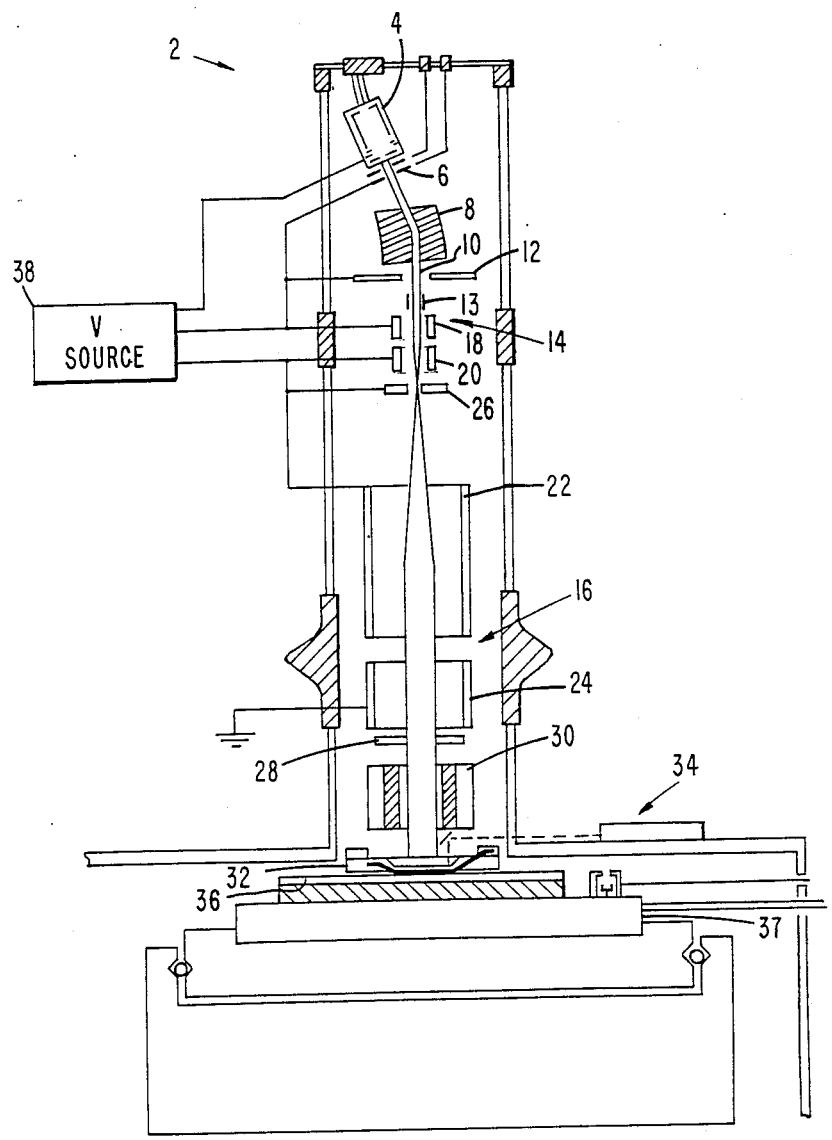
FIG. 1 is a schematic-type elevational view illustrating the principal components of an overall MIBL exposure system using invention.

A schematic-type elevational drawing of an MIBL system contemplated by the present invention is shown in FIG. 1. The system features a compact, vertical ion beam column approximately 1.7 meters in total length, which is considerably smaller than prior ion implantation accelerators used for MIBL applications. The system is capable of producing an H+ ion beam with energies up to 300 keV and current densities up to 5 $\mu A/cm^2$.

The MIBL optical column includes a surrounding vacuum enclosure, indicated by reference 2, which provides mechanical support for the various components of the system. For purposes of simplification, details of the vacuum enclosure are not shown, nor are cooling systems for some of the components or the details of electrical leads. These items are conventional in nature, and can be implemented as desired.

A high efficiency H+ ion source 4 is located at the top of the column. The ion source is of the arcdischarge type with magnetic mutlipole confinement. This type of device achieves high source efficiency by providing long confinement times for ionizing electrons, while maintaining a major portion of the plasma in an essentially field-free (less than 20 Gauss) region. Such field-free regions are occupied by uniform, quiescent plasmas with low effective plasma temperatures suitable for extracting high optical quality ion beams. A small (less than 0.2''), slowly diverging (less than 15 mrad) beam is extracted from the source by a two-stage extraction mechanim 6. Extractor 6, described in more detail below, regulates the extracted current level by the field in its first stage, and controls the extracted beam divergence predominantly by the field in its second stage.

After receiving its initial acceleration from extractor 6, the beam is directed to a variable field sector electromagnet 8, which causes the various particles within the beam to be angularly deflected by amounts that vary in proportion to the mass of each particle. The magnet is specially designed so that H+ ions within the beam are deflected to a desired beam path 10, while heavier ions are deflected by lesser amounts and thereby eliminated from the beam. The magnet is further designed to preserve a high quality virtual point source for the beam, which is important in the further manipulation of the beam within the optical column, and also keeps the cross-section of the beam generally circular. The removal of higher mass ions and neutral beam components is necessary to control the resist exposure dose, and to reduce mask heating effects.

Sector magnet 8 is positioned within the optical column at a location at which the beam has received an initial acceleration but prior to full acceleration to the final desired energy level, since the required magnetic fields at the lower energy location are considerably less.

The magnet structure can thus be made more compact than would be the case for a magnet capable of handling H+ ions with energies up to 300 keV. Furthermore, the elimination of heavier particles prior to full acceleration reduces the electrical load on the high voltage supplies, and eliminates the radiation background produced by stopping high energy ions. The sector magnet is carefully designed so that the beam is matched to the optics of the acceleration stages, described below.

After processing by the sector magnet, the essentially pure H+ beam is passed through the central aperture of a plate 12 to limit stray ions. The radius of the beam at the aperture is limited to about 0.15 cm., and its angular divergence is limited to 10 mr. An octupole deflector 13 is positioned below aperture plate 12 to provide a mechanism for performing fine adjustments in the alignment of the mass analyzed beam with the optical axis of the column, and in the shape of the beam. This deflector can also be used in effect to periodically turn the beam "off" during the wafer stepping and alignment periods when the MIBL system is used in a high throughput mode. The beam is turned "on" only during those periods when actual resist exposure is desired, typically about 0.5 second out of a total 1.5 second step-align-exposure cycle. Applying an appropriate voltage to octupole 13 deflects the beam out of the column path, in effect "blanking" the beam. While a lesser number of electrodes could be used to accomplish this periodic blanking, an octupole is preferred because the same device can be used to align and shape the beam. A DC voltage is applied to the octupole for the aligning and shaping function, with a much higher voltage super-imposed to control beam "blanking".

Upon emerging from aperture plate 12 and octupole 13 the beam is processed by a pair of dual cylinder lenses 14 and 16. Such lenses have the advantage of having constant optical properties when accelerating the beam by a fixed multiple of its energy at the entrance to the lens. The first lens 14 comprises a pair of hollow cylinders 18 and 20, between which a voltage differential is established to focus the beam at an angle of convergence which is at least three times its angular divergence upon entering the lens. The second lens 16 consists of another pair of hollow cylinders 22 and 24, between which another voltage differential is established. The first lens 14 focuses the beam to a crossover at the focal point of the second lens 16, so that the beam is highly collimated when it emerges from lens 16. With appropriate applied voltage differentials, each lens increases the beam energy by a factor of 5 for a total energy multiplication of 25 (the increase in beam energy by each lens is equal to the ratio of its exit voltage over its entrance voltage, all relative to the ion source voltage).

The beam crossover point is mechanically limited by an aperture plate 26 on which current can be monitored to control a final adjustment of the first lens 14, fixing its demagnified image at the focal point of the second lens. From the crossover point, the beam expands at an amplified angular divergence compared to its initial divergence until it reaches the principle plane of the second lens 16. At the second lens the H+ ions are collimated into a substantially parallel beam, with a divergence of less than 2 mrad and a diameter of 1.7 cm or greater. Thus, the use of the demagnifying first lens 14 enables the achievement of a small geometry in the ion source/magnet region by initially generating a small, low divergence beam and then expanding the beam in the first lens acceleration stage to obtain the final beam dimensions. At the same time, the aperture plate 26 at the beam crossover point ensures proper beam optics upon entry to the second lens, while discriminating against any neutral beam components which may have formed between magnet 8 and the first lens 14.

The overall length of the optical column from the entrance of the first lens to the exit of the second lens is approximately one meter. With a maximum applied voltage of 300 kV, the lenses are thus contained within substantially the maximum lengths over which the maximum column voltage can be isolated by the atmospheric side of the insulating vacuum walls 2. These walls consist of a series of ceramic insulators capable of isolating a total of 300 kV, while providing vacuum-tight seals to a level of $10^{-3}$ Pa or less. The insulators are joined by means of bonded metal flanges which match the insulator expansion coefficient and are also used to support and align the lens elements. To optimize the resistance of the insulators to voltage breakdown, shadow rings made from insulating polymeric material are used to increase the insulator surface path and to support corona shields with a radius of 6" or more around the mated flanges.

Another apertured plate 28 positioned immediately below the second lens 16 has a large aperture designed to conform the shape of the beam to the mask opening. Below this aperture plate another octupol deflector 30 is positioned in the beam path to steer the beam into alignment with channeling axis of the underlying mask. The mask is generally formed from a single crystal silicon membrane, characterized by periodic "channels" through which the beam can pass with minimum scatter, absorption and energy loss. An octupole deflector is preferred because it provides x-y deflection combinations in a very compact package. To steer a 300 keV H+ ion beam with a diameter of 2.3 cm by ±1°, the octupole has a 10 cm. bore and 20 cm. long electrodes, with biases of ±2500 volts or less. The octupole power supply preferably regulates the biases applied to the octupole to within 0.1%, corresponding to a beam tilt angle of less than 0.025 mrad, and programs the voltages with an accuracy of 1% of full scale. The alignment position is determined by peaking of the transmitted proton flux, which is monitored by a Faraday cup placed behind the mask.

The beam steering capability provided by octupole deflector 30 enables a convenient adjustment of the beam path to maintain a proper angular orientation between the beam and the channeling mask. This replaces the cumbersome prior technique which required a tilting of not only the mask but the wafer and its support stage to maintain the necesssary angular alignment. With the present invention the mask position can be fixed.

A mask 32 is positioned in the beam path below octupole deflector 30. The mask positioning mechanism includes an automatic alignment system 34 such as that disclosed in U.S. patent application Ser. No. 590,135, filed Mar. 16, 1984 by John L. Bartelt, one of the present inventors and having a common assignee with this application. The system detects alignment marks on the mask and actuates a positioning adjustment mechanism to maintain proper alignment. A semiconductor wafer substrate 36 is supported on a wafer platform 37 below the mask. The shaped and collimated ion beam passes through the mask to expose a resist on the wafer, except for the areas delineated by the mask pattern. The wafer platform 37 is equipped with an appropriate mechanism to effect step and repeat movements, as known in the art, for replicating the mask pattern on the substrate. It is important to note that the tilt of the ion beam produced by the octupole deflector 30 to align the beam with the possibly non-normal mask-channeling axis can cause an apparent image shift with respect to the mask-wafer alignment apparatus. This shift is corrected in real time by feeding the octupole deflection voltages into the mask-wafer alignment electronics. A wafer position change is thus produced that compensates for the ion beam shift.

A variable power supply 38 provides the necessary voltages to the various stages of the acceleration column. To maintain beam stability and uniformity, a power supply having regulation and ripple of not more than 0.1% should be used. If more stringent stabilization is necessary, closed feedback control loops can be inserted to control parameters such as the current level of the initial beam, or the beam energy after passage through the sector magnet. In general, the beam current intensity should be maintained to within 10% of a predetermined value.

The power supply 38 provides a DC voltage in the range of 200-300 kV to the ion source 4, a voltage in the range of 192-288 kV to the extraction electrodes 6, aperture plate 12 and the entrance cylinder 18 of the first lens, and a voltage in the range of 160-240 kV to the first lens exit cylinder 20, aperture plate 26 and the second lens entrance cylinder 22; the second lens exit cylinder 24 is grounded. All of the voltage outputs from the power supply vary together, so that all of the voltage outputs are at similar points within their respective ranges at any given time.

It can be seen that, taking the ion source voltage as a reference, the ratio of the voltages applied to the exit and entry cylinders of the first lens 14 is 5:1, and the ratio of the voltages applied to the exit and entrance cylinders of the second lens 16 is likewise 5:1. Specifically, if the various voltage outputs from power supply 38 are in the middle of their ranges, the voltage at the extraction electrode 6 and at the first lens entrance cylinder 18 relative to the ion source will be −10 kV, the voltage at the first lens exit cylinder 20 and the second lens entrance cylinder 22 will be −50 kV, and the voltage at the second lens exit cylinder 24 will be −250 kV. Since the outputs from power supply 38 vary in tandem with each other, a simple adjustment of the power supply can be used to alter the beam power, while maintaining the voltage ratios across the two lenses at 5:1 to preserve the beam dimensions.

Figure 2:
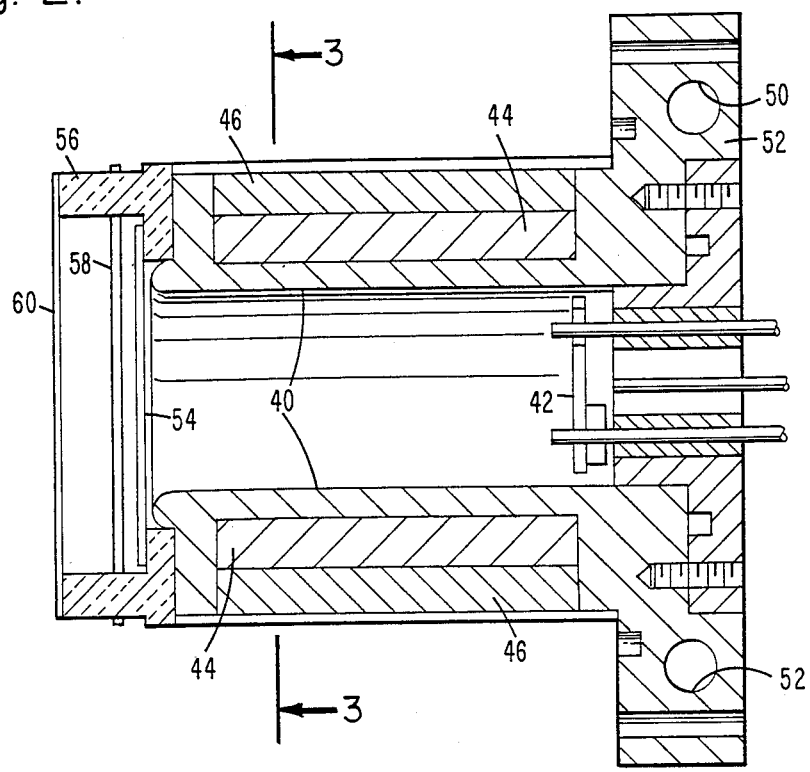
FIG. 2 is a sectional view of an ion beam source used in the MIBL system.
Figure 3:
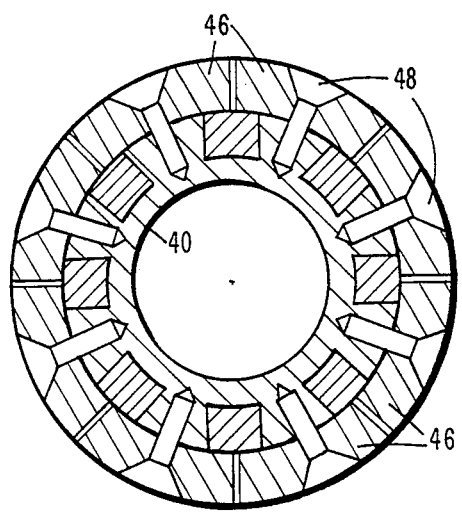
FIG. 3 is a sectional view taken along the lines 3—3 of FIG. 2.

Details of the preferred H+ ion source are shown in FIGS. 2 and 3. $H_2$ gas is bled into an arc chamber 40, in which electrons from a tungsten filament 42 ionize the gas to produce a plasma discharge. Rare earth (Sm-Co) permanent magnets 44 are mounted in an octupole configuration centered about the cylindrical axis of the arc chamber to confine the plasma toward the center of the chamber. The magnet fields increase the electron path lengths, causing more electron-ion collisions within the plasma, and enhancing the conversion of $H_2$ to $H^+$. The magnetic field outside the chamber is clamped by mild steel yokes 46 connecting neighboring magnet pairs. A clamp 48 is provided within each yoke to hold it in place with respect to the arc chamber. To protect the magnets from overheating and a subsequent loss of field strength due to the discharge power, the arc chamber is cooled by a forced Freon flow through an orifice 50 in the chamber back plate 52.

Inside the arc chamber the magnetic field intensity varies from about 1.5 kG at the wall near a pole to less than 10 G at the chamber axis. This configuration combines a high electron confinement at the anode walls, resulting in a high discharge efficiency, with a low field region (less than 20 G) in which a quiescent plasma can be created. Electrons are confined at either end of the arc chamber by graphite electrodes 54 biased at the cathode potential. This bias on the plasma confinement electrodes provides some initial collimation of the emitted ions prior to the influence of the extraction electrodes, discussed immediately below.

Confinement electrode 54 is mounted on a boron nitride insulating fixture 56 which extends forward from the emission end of the arc chamber. A first extraction electrode 58 is held by the insulating fixture parallel to and spaced away from the confinement electrode 54, while a second extraction electrode 60 is held by the insulating fixture parallel to and spaced away from first extraction electrode 58 on the opposite side thereof from confinement electrode 54. Each of the electrodes has a central aperture for the passage of an ion beam from within the arc chamber.

As an alternate to the ion source configuration shown in FIGS. 2 and 3, a set of annular magnets concentric with the arc chamber and polarized in the axial direction may be used. This arrangement provides a somewhat larger field-free region, but has lower overall efficiency due to lower magnetic field strengths at the chamber wall, resulting in higher electron losses. The larger field-free region, however, would permit the extraction of larger area beams if desired.

Figure 4:
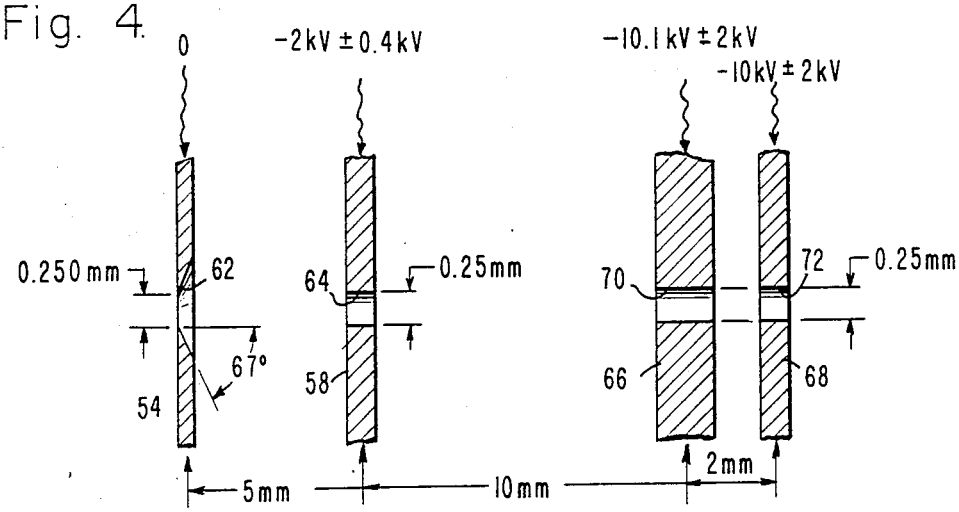
FIG. 4 is an enlarged fragmentary sectional view of the electrode assembly fragmentary sectional view of the electrode assembly used to extract ions from the ion source and form them into an intial beam.

Details of the extraction mechanism used to obtain an ion beam with a virtual point source are shown in FIG. 4. The dimensions, relative positions and voltages applied to the electrodes are designed to produce an ion beam with a desired size and angular divergence. The orientation of the electrodes in FIG. 4 is a mirror image of the representation shown in FIG. 2. Confinement electrode 54 is about 0.25 mm thick, with a 0.25 mm diameter aperture 62 which flares outwardly away from its axis at an angle of 67°. The voltage potential of electrode 54 may be taken as a zero reference for purposes of comparison with the voltages applied to the other electrodes.

The first extraction electrode 58 is spaced about 5 mm from electrode 54, and is 0.5 mm thick with a 0.25 mm diameter aperture 64, and a nominal applied voltage of −2 kV with respect to the voltage on electrode 54.

The second extraction electrode 60 actually consists of a pair of parallel electrodes 66 and 68. The center of electrode 66 is spaced 10 mm from the center of the first extraction electrode 58, and has a thickness of 1 mm. Electrode 68, the center of which is spaced 2 mm from the center of electrode 66 on the other side from electrode 58, is 0.5 mm thick. The respective apertures 70, 72 of electrodes 66 and 68 are each 0.25 mm in diameter and are aligned with the apertures of electrodes 58 and 54. Nominal voltages of −10.1 kV and −10 kV are applied to electrodes 66 and 68, respectively. Electrode 60 is implemented in a dual parallel electrode configuration with the first electrode having a slightly higher voltage to prevent the downstream electrons from entering the discharge chamber.

The nominal voltages applied to the various electrodes can be adjusted by up to ±20% to control the output energy of the beam. With the configuration shown, H+ beams of 8 to 12 keV can be produced with current and collimation constant to within ±10%. In conjunction with the two accelerating lenses in the column design, this energy range corresponds to a final beam energy of 200-300 keV.

For improved collimation of the extracted beam, the electric field strength in the first gap between electrodes 54 and 58 is one-half that of the field strength in the second gap between electrodes 58 and 66. Enhanced performance in terms of current intensity, source efficiency and beam collimation is achieved by biasing the plasma confinement electrode 54 at the source cathode potential, which in FIG. 4 is taken as a zero reference. The small diameter of aperture 62 in confinement electrode 54 provides a very low neutral gas flow from the ion source. As a result, the $H_2$ gas experiences a long residence time in the discharge chamber, enhancing the probability of H+ ion generation. Furthermore, the low gas load permits background pressures of less than $10^{-5}$ Torr to be maintained in the ion source region while vacuum pumping only from the low voltage end of the column in the region of the second lens 16. Thus, the loss of beam current due to charge exchange processes is reduced and voltage isolation conditions are preserved without the need for a separate high voltage vacuum system or a cumbersome differential pumping scheme. The beam extraction mechanism of FIG. 4 has been used to produce beams of 15-20 $\mu$A at 10 keV with angular divergences of 10-12 mrad at background pressures of less than $5 \times 10^{-6}$ Torr.

Figure 5:
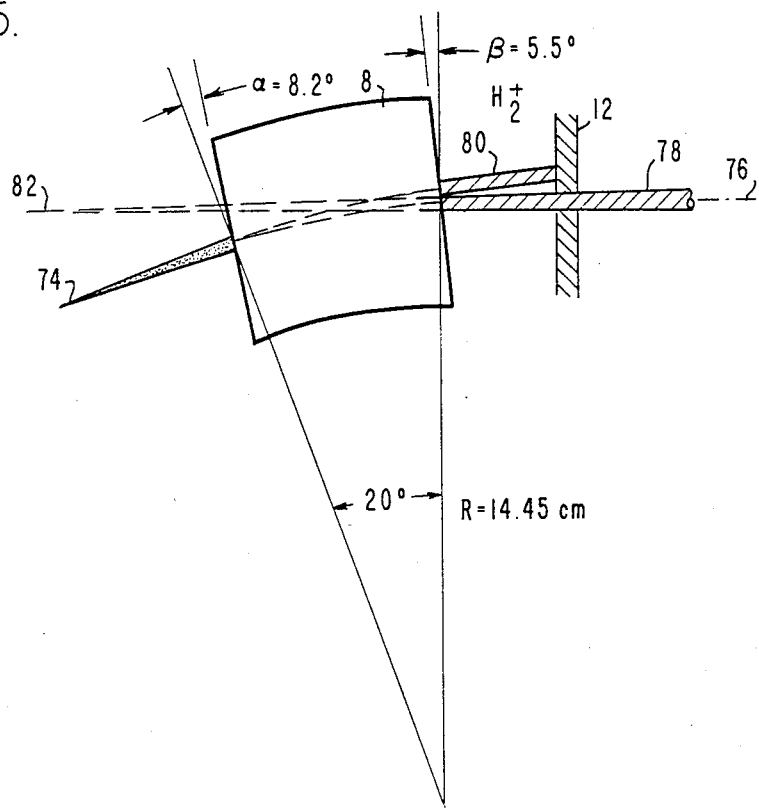
FIG. 5 is an illustrated drawing of the sector magnet used to deflect the beam particles in accordance with their respective masses.

The preferred design of the variable field sector electromagnet 8 is shown in FIG. 5. The expanding beam 74 which emerges from the extraction electrodes generally includes undesired particles, such as H atoms and molecules, metal impurity ions resulting from sputtering inside the ion source, and sometimes ions from impurity gases. The magnet 8 angularly deflects the paths of the various particles within the beam. The amount by which each particle is deflected varies in inverse proportion to its mass, and the magnet is specially designed so that substantially only H+ ions are transmitted along a desired path 76 corresponding to the axis of the MIBL column. The action of the magnet is to deflect H+ ions into alignment with designed path 76 without substantially changing its cylindrical symmetry. Thus, the H+ beam 78 emerging from the magnet is characterized by a virtual point source, which is important for the later processing of the beam by lenses 14 and 16. Heavier particles, such as beam 80 comprised of $H^+_2$, are deflected by lesser amounts and are blocked by aperture plate 12.

The primary characteristics of magnet 8 are illustrated in FIG. 5. A 20° sector electromagnet is used with a 1.5 cm pole gap and flat, tilted pole faces. The entrance and exit pole face tilt angles are +8.2° and +5.5°, respectively. For an incident beam energy of 10 kev and a field of 1 kG, the magnet has a mass resolution of greater or equal to 3.2, and produces a symmetric beam which appears to originate from a point source 82 located 12.9 cm behind aperture plate 12.

Figure 6:
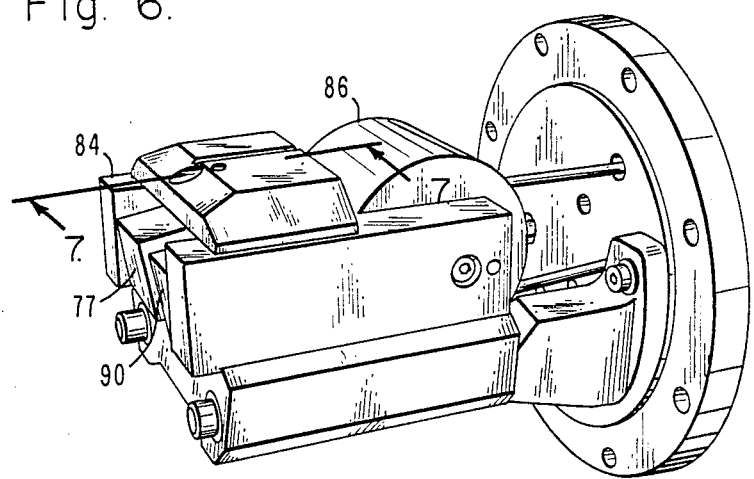
FIG. 6 is a fragmentary perspective view of a portion of the sector magnet assembly.

The magnet pole structure is illustrated in FIG. 6. An iron yoke 84 supports and provides a magnetic coupling between an iron core 86 about which a conductive coil (not shown) is wrapped, and one of the magnetic pole pieces 88. An opposed magnetic pole piece 90 and the opposite end of core 86 are supported and magnetically coupled together by a second iron yoke (not shown). The ion beam passes between the two pole pieces, and is deflected by the magnetic field therebetween.

Figure 7:
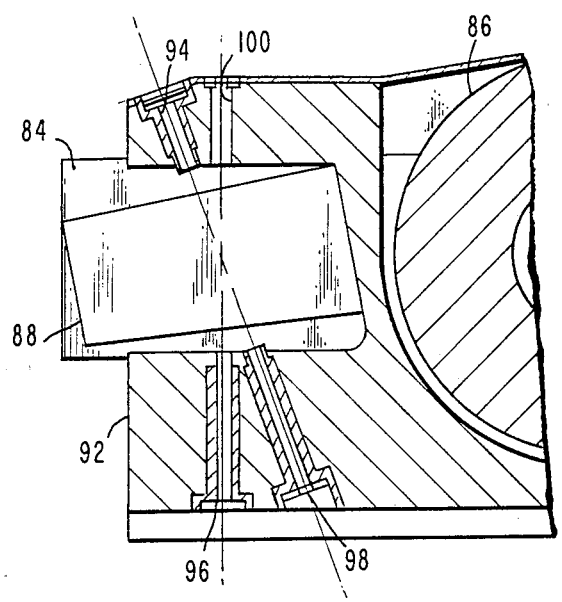
FIG. 7 is a sectional view of a portion of the sector magnet assembly.

It is important that the ion source/extractor mechanism be accurately fixed or positionally adjusted with respect to the magnet and to the column less assembly. In general, the mechanical alignment accuracy should be less than 10% of the beam diameter. Mounting structures are preferably provided for both the ion source and magnet assembly which provide fine x, y and angular adjustments. A portion of the magnet mounting structure which is intended to facilitate alignment with the ion source is shown in FIG. 7. The support structure 92 which holds yoke 84 in place includes an entrance port 94 which admits the ion beam from the source and extractor electrodes, an exit port 96 which transmits the deflected H+ beam emerging from the magnet, and an alignment port 98 which is coaxial with entrance port 94 on the opposite side of the magnet. A second alignment port 100 is formed on the opposite side of the magnet from, and coaxial with, exit port 96. The magnet assembly is aligned to the MIBL column axis using a laser beam directed along the axis of ports 96 and 100, while the magnet assembly is aligned with the ion source using a laser beam directed along the axis of apertures 94 and 98. The small physical dimensions of the source and magnet permit the complete assembly, which comprises the high voltage section of the MIBL system, to be packaged in a very compact geometry.

Referring back to FIG. 1, after the H+ beam has passed through the magnet it arrives at the first lens 14, which increases the angular expansion of the beam by a factor greater than 3 beyond the beam crossover point at aperture plate 26. Beyond aperture plate 26 the beam expands as it drifts approximately 27 cm. along the column axis, until it reaches the principal plane of the second lens 16. Here the H+ ions are collimated into a parallel beam with a divergence of less than 2 mrad and a diameter of 1.7 cm or more. The H+ ions emerge from the lens with a final energy of 200-300 keV, depending upon the setting of the power supply. After emerging from lens 16, the beam is apertured by plate 28 to about 1.5 cm diameter to eliminate any non-uniformities in the fringes of the beam profile prior to its entrance into octupole deflector 30. In octupole deflector 30 the beam is steered into alignment with the channeling axis of mask 32.

An MIBL system and method has thus been shown and described which offers considerable advantages over the prior art. It is much more compact than alternate systems, thereby reducing the costs associated with semiconductor fabrication clean rooms, lessening the possibility of beam deflection by external magnetic fields, and reducing vacuum pumping requirements. The described system provides all of the performance capabilities necessary for MIBL within a package that is 4-5 times smaller and much more energy efficient than typical ion implantation accelerators, and is comparable in size to an electron beam exposure column. It is believd to be the most compact of any ion beam exposure system with a similar range of beam energy and size requirements, and is considerably less expensive than ion implantation devices. As numerous variations and alternate embodiments will occur to those skilled in the art, it is intended that the invention be limited only in terms of the appended claims.

What is claimed is:

1. A masked ion beam lithographic system, comprising:

an ion source, means for extracting ions from the source and forming the ions into an expanding beam, means for substantially collimating the beam with divergences and dimensions suitable for lithographic exposure, means for positioning a crystalline channeling mask at a substantially fixed angular orientation in the beam path, means for aligning a resist coated substrate at a substantially fixed angular orientation with respect to the mask, means for steering the collimated beam into a fixed alignment with the chaneling axis of the fixed mask, and means for adjusting the position of the substrate generally transverse to the beam to compensate for steering of the beam and to maintain a substantially fixed mask image on the substrate.

2. A mask ion beam lithographic system, comprising:

an ion source means for extracting ions from the source and forming the ions into an expanding beam, a sector magnet in the extracted ion path, the magnet being adapted to deflect particles in the beam in accordance with the mass of each particle, the magnet deflecting and transmitting ions of a predetermined mass along a desired expanding beam path having a virtual source, means for substantially collimating the beam with divergences and dimensions suitable for lithographic exposure, means for positioning a crystalline channeling mask at a substantially fixed angular orientation in the beam path, means for aligning a resist coated substrate at a substantially fixed angular orientation with respect to the mask, and means for steering the collimated beam into alignment with the channeling axis of the fixed mask.

3. The masked ion beam lithographic system of claim 2, said means for forming the extracted ions into an expanding beam comprising means positioned between the ion source and magnet for forming the ions into a beam with an initial angular expansion, and a lens positioned in the ion path between the magnet and the collimating means and adapted to focus the beam to a crossover with an angular convergence substantially greater than the beam's angular expansion upon exiting the magnet, thereby amplifying the angular expansion of the beam delivered from the magnet beyond the crossover.

4. The masked ion beam lithographic system of claim 2, the means for steering the collimated beam into alignment with the channeling axis of the mask comprising an octupole deflector positioned between the collimating means and the mask.

5. The masked ion beam lithographic system of claim 2, the beam collimating means comprising a lens positioned in the beam path and adapted to substantially collimate the beam without deleting substantial portions thereof.

6. The masked ion beam lithographic system of claim 2, further comprising a plurality of electrodes positioned adjacent the beam path between the extraction and collimating means, said electrodes being adapted to deflect the beam away from the mask during beam blanking periods of a substrate exposure sequence.

7. The masked ion beam lithographic system of claim 6, said electrodes comprising an octupole deflector which is also adapted to shape and align the beam with respect to the collimating means.

8. The masked ion beam lithographic system of claim 2, further comprising means for moving the substrate in step and repeat movements relative to the beam to replicate the mask pattern on the substrate.

9. A masked ion beam lithographic system, comprising:

an ion source, means for extracting ions from the source and forming the ions into an expanding beam, the extracting means comprising a pair of electrodes spaced in succession from the ion source, and means for applying a first voltage differential across the electrodes with a relatively lower voltage to the electrode nearer the source and a relatively greater voltage to the electrode more distant from the source, the electrode spacings and applied voltages being selected to extract ions from the source past the electrodes and to impart a predetermined energy level to the extracted ions, means for substantially collimating the beam with divergences and dimensions suitable for lithographic exposure, the collimating means including means for processing the beam across a second voltage differential and thereby amplify the ion energy level by a predetermined amount, means for positioning a crystalline channeling mask at a substantially fixed angular orientation in the beam path, means for varying said first and second voltage differentials in substantially the same ratio to control the beam energy, means for aligning a resist coated substrate at a substantially fixed angular orientation with respect to the mask, and means for steering the collimated beam into alignment with the channeling axis of the fixed mask.

10. A beam forming mechanism for use in a masked ion beam lithographic system, comprising:

an $H^+$ ion beam source adapted to produce an $H^+$ ion beam having a substantially point source, a sector magnet positioned in the beam path to deflect particles in the beam in accordance with the mass of each particle, the magnet deflecting $H^+$ ions along a desired beam path to exit the magnet as an expanding beam having an virtual source, and deflecting higher mass particles in the beam along other paths, the magnet being substantially characterized as a 20° sector electromagnet with a 1.5 cm. pole gap, a flat entrance pole face at a tilt angle of substantially $+8.2°$, and a flat exit pole face at a tilt angle of substantially $+5.5°$, means for processing the deflected beam to demagnify its virtual source, and optical means for substantially collimating the processed beam.

11. The beam forming mechanism of claim 10, the processing means comprising a first lens adapted to focus the exit beam from the magnet to a crossover with an angular convergence substantially greater than the angular divergence of the beam exiting from the magnet, and the optical means comprising a second lens adapted to substantially collimate the beam beyond its crossover point from the first lens, the second lens being positioned in the beam path at a location corresponding to a desired collimated beam diameter.

12. A beam forming mechanism for use in a masked ion beam lithographic system, comprising:
   an ion beam source adapted to produce a beam of a desired ion having a predetermined angular divergence,
   means for removing particles of different mass than the desired ion from the beam and for redirecting the beam with a virtual source image,
   a first lens positioned in the beam path to focus the beam to a crossover with an angular convergence substantially greater than said predetermined angular divergence and to demagnify the source image of the beam, and
   a second lens adapted to substantially collimate the beam beyond its crossover point from the first lens, the second lens being positioned in the beam path at a location corresponding to a desired collimated beam diameter.

13. The beam forming mechanism of claim 12, the first and second lenses each comprising dual cylinder lenses, and further comprising means for establishing predetermined substantially fixed voltage differential ratios across the entrance and exit cylinders of each lens to shape the beam and accelerate the ions in the beam, and means for varying the absolute values of said voltage differentials while retaining said fixed ratios.

14. The beam forming mechanism of claim 13, the ion beam source including an extraction exit electrode imparting an initial energy level to the beam ions, and further comprising means for maintaining said electrode at the same voltage level as the entrance cylinder for the first lens, and means for maintaining the exit cylinder for the first lens at the same voltage level as the entrance cylinder for the second lens.

15. The beam forming mechanism of claim 14, wherein the ion source, extraction electrode/first lens entrance cylinder, and first lens exit cylinder/second lens entrance cylinder are maintained at voltages within the approximate ranges of 200–300 kV, 192–288 kV and 160–240 kV, respectively, relative to the second lens exit cylinder voltage.

16. The beam forming mechanism of claim 13, wherein the angular divergence of the beam at the entrance to the first lens is approximately 10 mr, the first lens amplifies the beam's angular divergence by a factor of at least three beyond the beam crossover point, the diameter of the beam after collimation by the second lens is at least about 1.7 cm., and the total column length from the beam source through the second lens is in the order of one-two meters.

17. The beam forming mechanism of claim 13, further comprising a beam aperture surrounding the focal point of the first lens, the aperture having a diameter small enough to limit stray ions in the beam.

18. The beam forming mechanism of claim 12, further comprising a crystalline channeling mask positioned in the collimated beam path, and an octupole deflector positioned in the collimated beam path between the mask and the second lens, the octupole deflector being adapted to steer the beam into alignment with the channeling axis of the mask.

19. A method for producing a beam suitable for use in a lithographic process, comprising the steps of:
   forming an expanding ion beam,
   substantially collimating the beam,
   holding an aligned lithographic mask and target at a substantially fixed predetermined angular position,
   steering the collimated beam into a predetermined fixed channeling alignment with the fixed mask,
   illuminating the target with the beam transmitted through the mask, and
   adjusting the position of the target generally transverse to the beam to compensate for steering of the beam and to maintain a substantially fixed mask image on the target.

20. The method of claim 19, wherein the beam is formed with an initial angular divergence, and further comprising the step of focusing the beam to a crossover with a greater angular convergence than the initial angular divergence to demagnify the beam's source image, whereby the beam after focusing has an amplified angular divergence and reaches a desired beam size beyond the crossover in a shorter distance than with its initial angular divergence.

21. The method of claim 20, wherein the beam ions are accelerated to higher energy levels during focusing and again during collimation.

22. The method of claim 20, wherein the beam is collimated by passing it through a collimating lens which is located a distance beyond the beam crossover corresponding to a desired beam size.

23. The method of claim 19, further comprising the step of blanking the beam by deflecting it away from a path to the mask prior to the beam being collimated.

24. The method of claim 21, wherein the mask is a channeling mask, and the beam is steered into alignment with its channeling axis.

25. A method for producing a beam suitable for use in a lithographic process, comprising the steps of:
   forming an expanding ion beam with an initial angular divergence, the beam including H+ ions,
   passing the initial beam through a sector magnet which is adapted to remove particles with masses greater than H+ from the beam, and to transmit the beam as an expanding beam with a virtual source,
   focusing the beam to a crossover with a greater angular convergence than the initial angular divergence to demagnify the beam's source image, whereby the beam after focusing has an amplified angular divergence and reaches a desired beam size beyond the crossover in a shorter distance than with its initial angular divergence,
   substantially collimating the beam,
   holding an aligned lithographic mask and target at a substantially fixed predetermined angular position,
   steering the collimated beam into a predetermined channeling alignment with the fixed mask, and
   illuminating the target with the beam transmitted through the mask.

* * * * *